United States Patent
Livshitz

(10) Patent No.: US 7,747,934 B2
(45) Date of Patent: Jun. 29, 2010

(54) METHOD FOR SELECTING LOW DENSITY PARITY CHECK (LDPC) CODE USED FOR ENCODING OF VARIABLE LENGTH DATA

(75) Inventor: Michael Livshitz, Rockville, MD (US)

(73) Assignee: Nortel Networks Limited, St. Laurent, Quebec (CA)

( * ) Notice: Subject to any disclaimer, the term of this patent is extended or adjusted under 35 U.S.C. 154(b) by 888 days.

(21) Appl. No.: 11/454,824

(22) Filed: Jun. 16, 2006

(65) Prior Publication Data

US 2007/0094580 A1   Apr. 26, 2007

Related U.S. Application Data

(63) Continuation-in-part of application No. PCT/CA2005/001563, filed on Oct. 12, 2005.

(60) Provisional application No. 60/635,525, filed on Dec. 13, 2004, provisional application No. 60/617,902, filed on Oct. 12, 2004, provisional application No. 60/627,348, filed on Nov. 12, 2004, provisional application No. 60/638,832, filed on Dec. 22, 2004, provisional application No. 60/639,420, filed on Dec. 22, 2004, provisional application No. 60/647,259, filed on Jan. 26, 2005, provisional application No. 60/656,587, filed on Feb. 25, 2005, provisional application No. 60/673,323, filed on Apr. 20, 2005.

(51) Int. Cl.
*H03M 13/00* (2006.01)
*G06F 11/00* (2006.01)

(52) U.S. Cl. .................................................. 714/800

(58) Field of Classification Search .................. 714/751, 714/800–801, 790
See application file for complete search history.

(56) References Cited

U.S. PATENT DOCUMENTS

| | | | |
|---|---|---|---|
| 7,178,080 B2 | 2/2007 | Hocevar | |
| 7,203,897 B2 | 4/2007 | Blankenship et al. | |
| 7,263,651 B2 * | 8/2007 | Xia et al. | 714/774 |
| 7,313,752 B2 | 12/2007 | Kyung et al. | |
| 7,581,157 B2 | 8/2009 | Oh et al. | |
| 7,607,063 B2 | 10/2009 | Kikuchi et al. | |

OTHER PUBLICATIONS

Zhang et al.,"VLSI Implementation-Oriented (3, k)-Regular Low-Density Parity-Check Codes", IEEE, pp. 25-36, Sep. 2001.
Niu, et al., "LDPC versus Convolutional Codes in MIMO-OFDM over 11n channels", IEEE 802.11-04/682r0, Jul. 2004, pp. 1-15.
Du, et al., "LDPC for MIMO Systems", IEEE 802.11-04/0714r0, Jul. 2004, pp. 1-12.

(Continued)

*Primary Examiner*—Shelly A Chase
(74) *Attorney, Agent, or Firm*—Pearne & Gordon LLP

(57) ABSTRACT

A method for selecting a low-density parity-check (LDPC) code for encoding variable sized data used in data communication systems. The method selects a LPCD code from a plurality of LDPC codes of different codeword lengths and code rates; by calculating a number of shortening $N_{shortened}$ bits and a number of puncturing $N_{punctured}$ bits for each of the plurality of LDPC codes, and determines a selected LDPC code from the plurality of shortened and punctured LDPC codes meeting a performance criterion.

19 Claims, 6 Drawing Sheets

OTHER PUBLICATIONS

Purkovic, et al., "Structured LDPC Codes as an Advanced Coding Scheme for 802.11n", IEEE 802.11-04/885r0, Sep. 2004, pp. 1-10.

Moschini, et al., "ST Microelectronics Partial Proposal for LDPCC As Optional Coding Technique for IEEE 802.11 TGN High Throughput Standard", IEEE 802.11-04/898R1, Aug. 2004, pp. 1-44.

Moschini, et al., "ST Microelectronics LDPCC Proposal for 802.11N CFP", IEEE 802.11-04/0900R0, Aug. 2004, pp. 1-20.

Stolpman, et al., "Irregular Structured LDPC Codes With Rate Compatibility for TGN", IEEE 802.11-00/XXX, Jan. 2000, pp. 1-18.

Stolpman, et al., "Structured LDPC Code Design", IEEE 802.11-04/1362R0, Nov. 2004, pp. 1-11.

Lindskog, et al., "Record and Playback PHY Abstraction for 802.11N MAC Simulations- Using Soft Per Estimates", IEEE 802.11-0410182 00R1, Feb. 16, 2004, pp. 1-12.

Sampath, et al., "Record and Playback PHY Abstraction for 802.11N MAC Simulations", IEEE 802.11-0410183 00R3, Mar. 15, 2004, pp. 1-24.

Stephens, et al., "IEEE 802.11 TGn Comparison Criteria (Phy-related 4.6 sections working document)", Intel Corp., IEEE 802.11-02/814r5, Dec. 2003, pp. 1-22.

Coffey, et al., "Joint Proposal High Throughput Extension to the 802.11 Standard: Phy", IEEE 802.11-05/1102 R4, Jan. 2006, pp. 1-80.

Edmonston, et al., "Turbo Codes for IEEE 802.11n", ICoding Technology, Inc., IEEE 802.11-4-0003-00-000n, Jan. 2004, pp. 1-20.

Simoens, et al., "Towards IEEE802.11 HDR in the Enterprise", Motorola, IEEE 802.11-02/312r0, May 2002, pp. 1-10.

Gorokhov, et al., "MIMO-OFDM for high throughput WLAN experimental results", Phillips Research, IEEE 802.11-02-708 R1, IEEE 802.11 session Hawaii Nov. 2002, pp. 1-23.

Mahadevappa, et al., "Different Channel Coding Options for MIMO-OFDM 802.11n", Realtek Semiconductors, Irvine, CA, IEEE 802.11-04/0014r0, Jan. 2004, pp. 1-22.

Jacobsen, et al., "LDPC FEC for IEEE 802.11n Applications", Intel Labs Communications Technology Laboratory, IEEE 802.11-03/0865r0, Nov. 10, 2003, Pp. 1-35.

Purkovic, et al., "*LDPV vs. Convolutional Codes* for 802.11n Applications: Performance Comparison", Nortel Networks, IEEE 802.11-04, 0071 r1, Jan. 2004, pp. 1-12.

Tzannes, et al., "Extended Data Rate 802.11a", Aware, Inc., IEEE 802.11-01/232r0, Mar. 2002, pp. 1-9.

Ouyang, et al., "On The Use Of Reed Solomon Codes for 802.11n", Philips Research, IEEE 802.11-04/96r0, Jan. 2004, pp. 1-9.

Liang, et al., "Simplifying MAC FEC Implementation and Related Issues", Texas Instruments Incorporated, IEEE 802.11-0210207r0, Mar. 2002, pp. 1-15.

Coffey, et al., "MAC FEC Performance", Texas Instruments, IEEE 802.11-021239r0, Mar. 2002, pp. 1-18.

IEEE Standards Interpretations for IEEE Std 802.11a™-1999, Copyright © 2008 by the Institute of Electrical and Electronics Engineers, Inc., Three Park Avenue, New York, New York 10016-5997 USA; pp. 1-6.

Schumacher, et al., "TGn Channel Models", Zyray Wireless, IEEE 802.11-03/940r4, May 2004, pp. 1-46.

Purkovic, et al., "*LDPC vs. Convolutional Codes*: Performance and Complexity Comparison", Nortel Networks, IEEE 802.11-04/XXXXR0, Mar. 2004, pp. 1-10.

Schumacher, et al., "Description of a Matlab® implementation of the Indoor MIMO WLAN channel model proposed by the IEEE 802.11 TGn Channel Model Special Committee", FUNDP — The University of Namur, Jan. 2004, Pp. 1-27.

R. Echard, et al., "The P-Rotation Low-Density Parity Check Codes", in Proc. Globecom 2001, Nov. 2001, pp. 980-984.

M.M. Mansour, et al., High-Throughput LDPC Decoders, IEEE Trans. on VLSI Systems, vol. 11, No. 6, Dec. 2003, pp. 976-996.

Classon, et al., "LDPC Coding for OFDMA PHY", Nov. 2004, pp. 1-7.

Syed Aon Mujtaba, "TGn Sync Proposal Technical Specification", Nov. 2004, pp. 143, Section 11.2.4.4.

Singh, et al., "WWiSE Proposal: High throughput extension to the 802.11 Standard", Aug. 2004, pp. 45-48, Section 20.3.5.7.3.

Yazdani, et al., "On Construction of Rate Compatible Low-Density Parity-Check Codes", IEEE Communication Letters, vol. 8, No. 3, Mar. 2004 (Abstract enclosed).

Ha, et al., "Puncturing for Finite Length Low-Density Parity Check Codes", ISIT 2004 (Abstract enclosed).

Tian, et al., "Rate Compatible Low-Density Parity-Check Codes", ISIT 2004, Chicago, pp. 153.

Ha, et al., "Rate Compatible Puncturing of Length Low-Density Parity-Check Codes", IEEE Transactions on Information Theory, vol. 50, No. 11, Nov. 2004 (Abstract enclosed).

Zhong, et al., "Design of VLSI Implementation-Oriented LDPC Codes", IEEE Semiannual Vehicular Technology Conference (VTC) Oct. 2003, pp. 1-4.

Richardson, et al., "Design of Capacity-Approaching Irregular Low-Density Parity-Check Codes", IEEE Transactions on Information Theory, Feb. 2001, vol. 47, No. 2, pp. 619-637.

Chung, et al., "Analysis of Sum-Product Decoding of Low-Density Parity-Check Codes Using a Gaussian Approximation", IEEE Transactions on information Theory, vol. 47, Feb. 2001, pp. 657-670.

Purkovic, et al "Algebraic Low-Density Parity-Check Codes for OFDMA PHY Layer", Nortel Networks, May 2004, pp. 1-8.

Hocevar, "LDPC Code Construction With Flexible Hardware Implementation", IEEE International Conference on Communications, 2003, vol. 4, pp. 2708-2712.

Hillman, "Minutes of High Throughput Task Group Meetings", Jan. 2004, pp. 1-19.

* cited by examiner

| 11 | 0 | 10 | -1 | 3 | 5 | 1 | 0 | -1 | -1 | -1 | -1 |
| 10 | 9 | 2 | -1 | 3 | 0 | -1 | 0 | 0 | -1 | -1 | -1 |
| 7 | 9 | 11 | 10 | -1 | 7 | -1 | -1 | 0 | 0 | -1 | -1 |
| 9 | 2 | -1 | 6 | -1 | 3 | 0 | -1 | -1 | 0 | 0 | -1 |
| 3 | 11 | 2 | 3 | 2 | -1 | -1 | -1 | -1 | -1 | 0 | 0 |
| 2 | 7 | 1 | 0 | 10 | -1 | 1 | -1 | -1 | -1 | -1 | 0 |

# METHOD FOR SELECTING LOW DENSITY PARITY CHECK (LDPC) CODE USED FOR ENCODING OF VARIABLE LENGTH DATA

RELATED APPLICATIONS

This application is a continuation-in-part of International Application PCT/CA2005/001563, with an international filing date of Oct. 12, 2005, which claims the benefits of U.S. Provisional Applications No. 60/635,525, filed Dec. 13, 2004; 60/617,902, filed Oct. 12, 2004; 60/627,348, filed Nov. 12, 2004; 60/638,832, filed Dec. 22, 2004; 60/639,420, filed Dec. 22, 2004; 60/647,259, filed Jan. 26, 2005; 60/656,587, filed Feb. 25, 2005; and 60/673,323, filed Apr. 20, 2005, all are herewith incorporated by reference in their entireties.

FIELD OF THE INVENTION

The present invention generally pertains to forward error correction. In particular, the present invention relates to encoding of variable length data using low density parity check (LDPC) code.

BACKGROUND OF THE INVENTION

In a typical communication system, forward error correction (FEC) is often applied in order to improve robustness of the system against a wide range of impairments of the communication channel.

Referring to FIG. 1, in which a typical communication network channel is depicted having an information source 101, sending data to a source coder 102 that in turn forwards the data to a channel encoder 103. The encoded data is then modulated by modulator 104 onto a carrier before being transmitted over a channel 105. After transmission, a like series of operations takes place at the receiver using a demodulator 106, channel decoder 107 and source decoder 108 to produce data suitable for the information sink 109. FEC is applied by encoding the information data stream at the transmit side at the encoder 103, and performing the inverse decoding operation on the receive side at the decoder 107. Encoding usually involves generation of redundant (parity) bits that allow more reliable reconstruction of the information bits at the receiver.

In many modern communication systems, FEC uses Low Density Parity Check (LDPC) codes that are applied to a block of information data of the finite length.

One way to represent LDPC codes is by using so-called Tanner graphs, in which N symbol nodes (also called variable nodes or bit nodes), correspond to bits of the codeword, and M check nodes (also called function nodes), correspond to the set of parity-check constraints which define the code. Edges in the graph connect symbol nodes to check nodes.

LDPC codes can also be specified by a parity check matrix H of size M×N. In the matrix H, each column corresponds to one of the symbol nodes while each row corresponds to one of the check nodes. This matrix defines an LDPC block code (N, K), where K is the information block size, N is the length of the codeword, and M is the number of parity check bits. M=N−K. A general characteristic of the LDPC parity check matrix is the low density of non-zero elements that allows utilization of efficient decoding algorithms. The structure of the LDPC code parity check matrix is first outlined in the context of existing hardware architectures that can exploit the properties of these parity check matrices.

One problem when using LDPC codes is a necessity to properly adjust the encoding procedure due to variable payload size and due to variable underlying transmission mechanism. Such encoding procedure typically assumes usage of shortening and puncturing techniques.

Furthermore, there may be a plurality of LDPC codes with different codeword lengths and code rates available. The number of the possible combinations may present a challenge to select the appropriate LDCP code to provide a suitable coding gain, and at the same time minimize the number of encoded packets, codewords and modulated symbols

SUMMARY OF THE INVENTION

Therefore, the present invention seeks to overcome or circumvent the above mentioned problems, and provide a method to enable flexible encoding procedures by using shortening, or puncturing, or a combination of shortening and puncturing among a number of codewords with different lengths and code rates; and selecting a codeword meeting a certain performance criteria.

In accordance with one aspect of the present invention there is provided a method for selecting a low-density parity-check (LDPC) code used for encoding variable sized data, the method comprising the steps of: a) providing a plurality of LDPC codes of different codeword lengths and code rates; b) calculating a number of shortening $N_{shortened}$ bits for each of the plurality of LDPC codes; c) providing a performance criterion; and d) determining a selected LDPC code from the plurality of shortened LDPC codes meeting the performance criterion.

Preferably, the method further comprises the step of calculating a number of puncturing $N_{punctured}$ bits for each of the plurality of LDPC codes, wherein the selected LDPC code is determined from the plurality of shortened and punctured LDPC codes meeting the performance criterion.

Preferably, the method further comprises the steps of: a) providing a plurality of performance criteria; and b) determining a subsequent subset when each of the plurality of performance criteria is applied to the subsets of LDPC codes meeting previous criteria.

Preferably, the performance criterion is selected from the group consisting of a range of effective coding rates, a range of basic coding rates, a range of numbers of transmission symbols, a range of $N_{punctured}$, a range of $N_{shortened}$, a range of parity bits in LDPC codewords, a range for normalized shortening to puncturing ratio, $q_{normalized}$, and a combination thereof.

Preferably, the performance criterion is selected from the group consisting of a minimum effective coding rate, a minimum basic coding rate, a minimum number of transmission symbols, a minimum for $N_{punctured}$, a maximum for $N_{shortened}$, a maximum number of parity bits in LDPC codewords, a maximum for normalized shortening to puncturing ratio, $q_{normalized}$, and a combination thereof.

Preferably, the method further comprises the steps of: selecting $N_{shortened}$ variable nodes from the selected LDPC code; ensuring a uniform or a close to uniform row weight distribution after removing columns corresponding to the selected $N_{shortened}$ variable nodes; and ensuring a new column weight distribution as close as possible to an original column weight distribution after removing the columns corresponded to the selected $N_{shortened}$ variable nodes.

Preferably, the method further comprises the steps of: selecting $N_{punctured}$ variable nodes from the selected LDPC code; ensuring each of the selected $N_{punctured}$ variable nodes is connected to fewest possible check nodes; and ensuring that all of the selected $N_{punctured}$ nodes are connected to most possible check nodes.

In accordance with another aspect of the present invention there is provided a device using a selected LDPC code obtained by: a) providing a plurality of LDPC codes of different codeword lengths and code rates; b) calculating a number of shortening $N_{shortened}$ bits for each of the plurality of LDPC codes; c) providing a performance criterion; and d) determining a selected LDPC code from the plurality of shortened LDPC codes meeting the performance criterion.

In accordance with another aspect of the present invention there is provided a storage medium readable by a computer encoding a computer program for execution by the computer to carry out a method for selecting a low-density parity-check (LDPC) code used for encoding variable sized data, the computer program comprising: code means for providing a plurality of LDPC codes of different codeword lengths and code rates; code means for calculating a number of shortening $N_{shortened}$ bits for each of the plurality of LDPC codes; code means for providing a performance criterion; and code means for determining a selected LDPC code from the plurality of shortened LDPC codes meeting the performance criterion.

BRIEF DESCRIPTION OF THE DRAWINGS

The invention and the illustrated embodiments may be better understood, and the numerous objects, advantages, and features of the present invention and illustrated embodiments will become apparent to those skilled in the art by reference to the accompanying drawings, and wherein.

DETAILED DESCRIPTION OF EMBODIMENTS OF THE INVENTION

Reference will now be made in detail to some specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Figure 1:
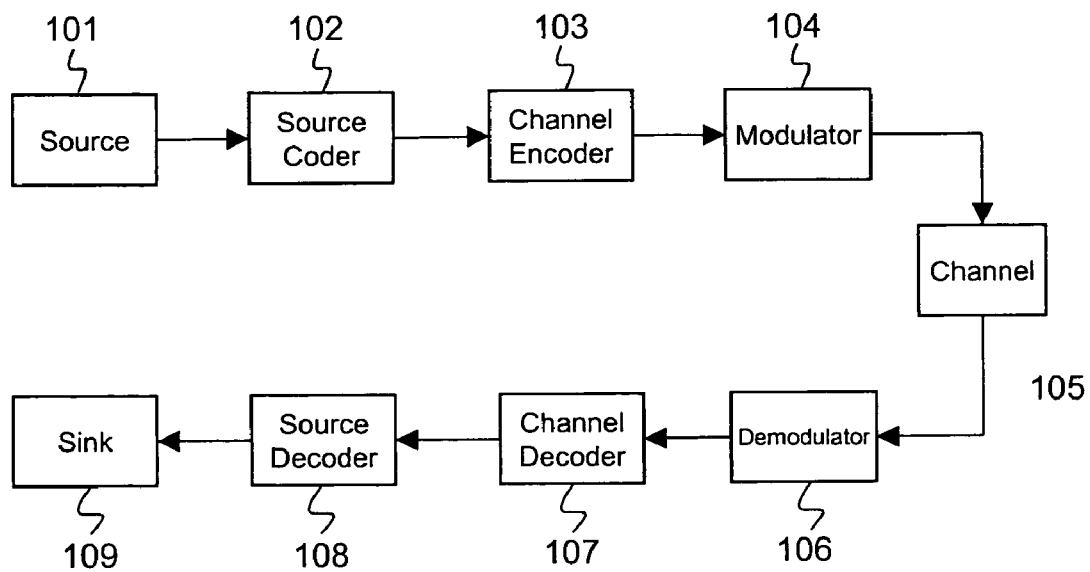
FIG. 1 shows a typical system in which embodiments of the present invention may be practiced.
Figure 2:
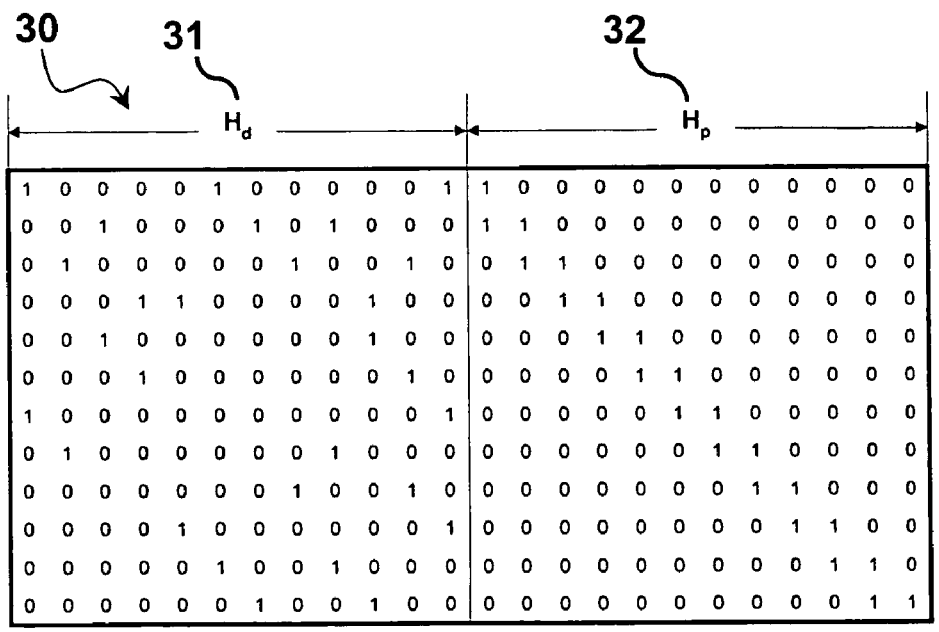
FIG. 2 depicts an example of a parity check matrix with dual diagonal.
Figures 3, 4:
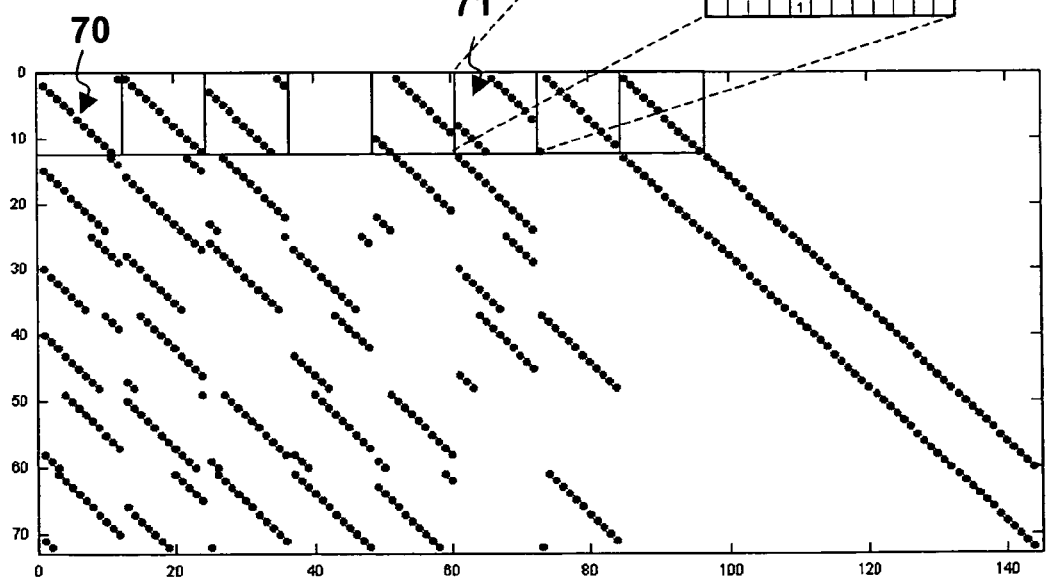
FIG. 3 illustrates an example of base parity check matrix.
FIG. 4 is an example of the expanded base parity check matrix of FIG. 3.

Referring to FIG. 2, and as described in related applications referenced herein, a typical parity check matrix 30 is partitioned as $H=[H_d|H_p]$. The data portion $H_d$ 31 is an M×K matrix that corresponds to the data bits of the codeword. The design of the $H_d$ 31 matrix ensures high coding gain. The parity portion $H_p$ 32 in this example is an M×M dual diagonal matrix and corresponds to the parity bits of the codeword. LDPC codes described here are systematic block codes. The codeword vector for these systematic codes has the structure:

$$c = \begin{bmatrix} d \\ p \end{bmatrix}$$

where $d=[d_0 \ldots d_{K-1}]^T$ is the block of data bits and $p=[p_0 \ldots p_{M-1}]^T$ are the parity bits. A codeword is any binary, or in general, non-binary, N-vector c that satisfies:

$$Hc = H_d d + H_p p = 0$$

Thus, a given data block d is encoded by solving binary equation $H_d d = H_p p$ for the parity bits p. In principle, this involves inverting the M×M matrix $H_p$ to resolve p:

$$p = H_p^{-1} H_d$$

$H_p$ is assumed to be invertible. If the inverse of $H_p$, $H_p^{-1}$ is also low density then the direct encoding specified by the above formula can be done efficiently. However, with the dual diagonal structure of $H_p$ 32 encoding can be performed as a simple recursive algorithm:

$$p_0 = \sum_{n=1}^{k_0} h_{0,i_n^0} d_{i_n^0},$$

where $i_n^0$ is the index of the column in which row 0 contains a "1"

$$p_1 = p_0 + \sum_{n=1}^{k_1} h_{1,i_n^1} d_{i_n^1},$$

where $i_n^1$ is the index of the column in which row 1 contains a "1"

$$p_{M-1} = p_{M-2} + \sum_{n=1}^{k_{M-1}} h_{M-1,i_n^{M-1}} d_{i_n^{M-1}},$$

where $i_n^{M-1}$ is the index of the column in which row M−1 contains a "1".

In these recursive expressions $h_{r,c}$ are non-zero elements (1 in this exemplary matrix) of the data portion of the parity check matrix, $H_d$ 31. The number of non-zero elements in rows 0, 1, ..., M−1, is represented by $k_0, k_1, \ldots, k_{M-1}$, respectively.

One desirable feature of LDPC codes is that they support various required code rates and block sizes. In order to support the required a plurality of code rates, a common approach is to have a small base parity check matrix defined for each required code rate and to support various block sizes by expanding the base parity check matrix. Since it is usually required to support a range of block sizes, a common approach is to define expansion for the largest block size and then apply other algorithms that specify expansion for smaller block sizes. Below is an example of a base parity check matrix:

| 11 | 0  | 10 | 6  | 3  | 5  | 1  | 0  | -1 | -1 | -1 | -1 |
|----|----|----|----|----|----|----|----|----|----|----|----|
| 10 | 9  | 2  | 2  | 3  | 0  | -1 | 0  | 0  | -1 | -1 | -1 |
| 7  | 9  | 11 | 10 | 4  | 7  | -1 | -1 | 0  | 0  | -1 | -1 |
| 9  | 2  | 4  | 6  | 5  | 3  | 0  | -1 | -1 | 0  | 0  | -1 |
| 3  | 11 | 2  | 3  | 2  | 11 | -1 | -1 | -1 | -1 | 0  | 0  |
| 2  | 7  | 1  | 0  | 10 | 7  | 1  | -1 | -1 | -1 | -1 | 0  |

In this example, the base parity check matrix is designed for a code rate R=½ and its dimensions are $(M_b \times N_b)=(6 \times 12)$. Assume that the codeword sizes (lengths) to be supported are in the range N=[72,144], with increments of 12, i.e. N=[72, 84, ..., 132, 144]. In order to accommodate those block lengths the parity check matrix needs to be of the appropriate size (i.e. the number of columns match N, the block length). The number of rows is defined by the code rate: M=(1−R) N. The expansion is defined by the base parity check matrix elements and the expansion factor L, which results in the maximum block size. The conventions used in this example, for interpreting the numbers in the base parity check matrix, are as follows:

−1 represents L×L all-zero square matrix, $0_L$, L equals 12 in this example;

0 represents L×L identity matrix, $I_L$.

integer, r (<L), represents L×L identity matrix, $I_L$, rotated to the right (for example) a number of times corresponding to the integer.

The following example shows a rotated identity matrix where the integer specifying rotation is 5:

| 0 | 0 | 0 | 0 | 0 | 1 | 0 | 0 | 0 | 0 | 0 | 0 |
|---|---|---|---|---|---|---|---|---|---|---|---|
| 0 | 0 | 0 | 0 | 0 | 0 | 1 | 0 | 0 | 0 | 0 | 0 |
| 0 | 0 | 0 | 0 | 0 | 0 | 0 | 1 | 0 | 0 | 0 | 0 |
| 0 | 0 | 0 | 0 | 0 | 0 | 0 | 0 | 1 | 0 | 0 | 0 |
| 0 | 0 | 0 | 0 | 0 | 0 | 0 | 0 | 0 | 1 | 0 | 0 |
| 0 | 0 | 0 | 0 | 0 | 0 | 0 | 0 | 0 | 0 | 1 | 0 |
| 0 | 0 | 0 | 0 | 0 | 0 | 0 | 0 | 0 | 0 | 0 | 1 |
| 1 | 0 | 0 | 0 | 0 | 0 | 0 | 0 | 0 | 0 | 0 | 0 |
| 0 | 1 | 0 | 0 | 0 | 0 | 0 | 0 | 0 | 0 | 0 | 0 |
| 0 | 0 | 1 | 0 | 0 | 0 | 0 | 0 | 0 | 0 | 0 | 0 |
| 0 | 0 | 0 | 1 | 0 | 0 | 0 | 0 | 0 | 0 | 0 | 0 |
| 0 | 0 | 0 | 0 | 1 | 0 | 0 | 0 | 0 | 0 | 0 | 0 |

Therefore, for the largest block (codeword) size of N=144, the base parity check matrix needs to be expanded by an expansion factor of 12. That way the final expanded parity check matrix to be used for encoding and generating the codeword of size 144, is of the size (72×144). In other words, the base parity check matrix was expanded $L_{max}$=12 times (from 6×12 to 72×144). For block sizes smaller than the maximum, the base parity check matrix is expanded by a factor L<$L_{max}$. In this case expansion is performed in the similar fashion except that now matrices $I_L$ and $0_L$, are used instead of $I_{Lmax}$ and $0_{Lmax}$, respectively. Integers specifying the amount of rotation of the appropriate identity matrix, $I_L$, are derived from those corresponding to the maximum expansion by applying some algorithm. For example, such an algorithm may be a simple modulo operation:

$$r_L = (r_{Lmax}) \text{modulo } L$$

Figure 5:
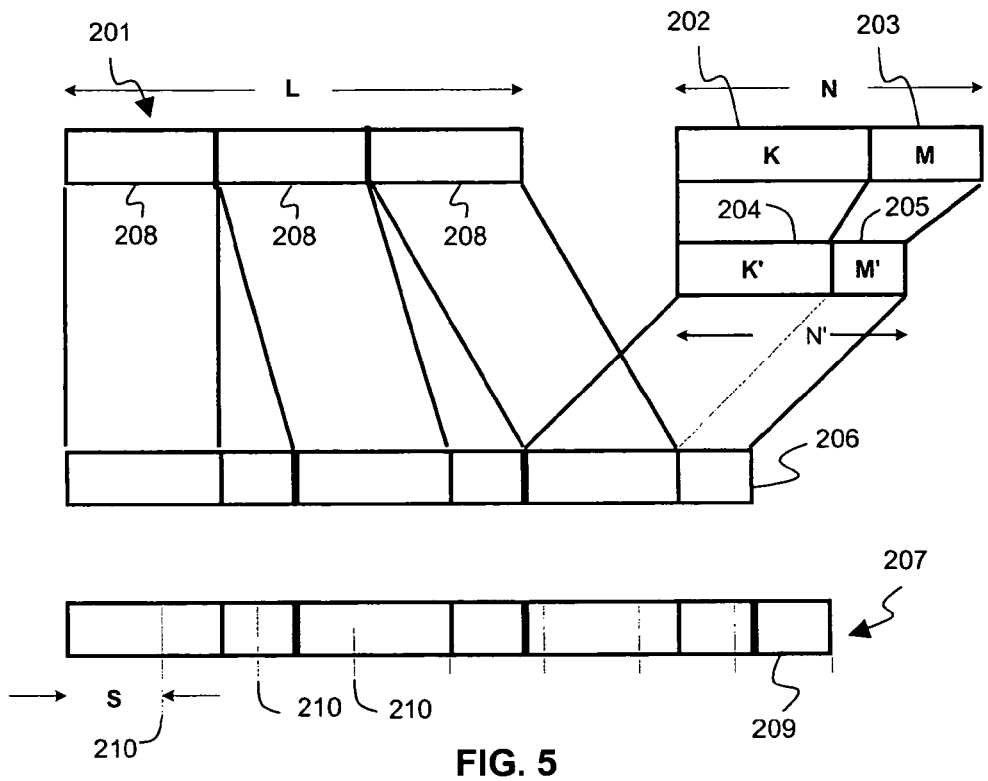
FIG. 5 illustrates encoding of data packets, using puncturing and shortening according to an embodiment of the present invention.

Referring to FIG. 5, a data packet 201 of length L is required to be encoded using an LDPC code (N, K), as previously presented, where K 202 is the information block size, N is the length of the codeword, and M 203 is the number of parity check bits, M=N−K. The encoded data 207 is to be transmitted using a number of modulated symbols, each carrying S bits.

The data packet 201 of length L is divided into segments L' 208. These segments are in turn encoded using an LDPC code (N, K). The information block K 202 may be optionally pruned to K' 204; and the parity check bits M may be pruned to M' 205. The term "shortening" is intended to mean applying code shortening by padding the information bits with K-L' zeros before encoding, and removing portion of these bits after encoding, thus sending less information bits than possible with a given code, (K'<K). The term "puncturing" is intended to mean removing some of the parity bits and/or data bits prior to sending the encoded bits to the modulator block and subsequently over the channel. Pruned codewords may be concatenated 206 in order to accommodate the encoded data packet, and the resulting stream 207 is padded with bits 209 to match the boundaries 210 of modulated symbols before being sent to the modulator. The amount of shortening and puncturing may be different for the constituent pruned codewords.

In encoding variable length data, the objectives are:
(a) Keep the performance in terms of coding gain as high as possible. This objective may translate into following requirements:
Select the largest suitable codeword from the available set of codewords. For the LDPC codes and other block codes, the longer the codeword the more coding gain can be achieved, although at certain codeword size the point of diminishing return is reached.
Adjust properly the amount of shortening and puncturing, as this directly affects the performance, and the efficiency of the transmission.
(b) Use as few modulated symbols as possible. This in turn results in savings in transmit power. This is especially important for battery operated hand held wireless devices by keeping the airtime at a minimum.
(c) Keep the overall complexity at a reasonable level, i.e. operate with a relatively small set of codewords of different sizes. In addition, it is desirable to have a code designed in such a way that various codeword lengths can be implemented efficiently.

From objective (c) above, it follows that in order to use a small number of codewords, an efficient shortening and puncturing operation needs to be applied. However, those operations have to be implemented in a way that would neither compromise the coding gain advantage of LDPC codes, nor lower the overall transmit efficiency unnecessarily. This is particularly important when using the special class of LDPC parity check matrices that enable simple encoding operation as described in related International Application PCT/CA2005/001563. These special matrices may employ either a lower triangular, a dual-diagonal, or a modified dual-diagonal in the parity portion of the parity check matrix corresponding. An example of a dual-diagonal matrix was described earlier in reference to FIG. 2 in which the parity portion $H_p$ 32 corresponds to the parity bits, and the data portion $H_d$ 31 to the information data bits.

Work to achieve efficient puncturing has been done using the "rate compatible" approach. One or more LDPC parity check matrix is designed for the low code rate application. By applying appropriate puncturing of the parity portion, the same matrix can be used for a range of code rates, which are higher than the original code rate, as the size of the data portion increases in relation to the codeword size. These methods predominantly target applications where adaptive coding (e.g. hybrid automatic repeat request, H-ARQ) and/or unequal bit protection is desired.

Puncturing may also be combined with code extension to mitigate the problems associated with "puncturing only" cases. The main problem addressed by puncturing in combination with code extension is to preserve an optimum degree distribution through the process of modifying the original parity check matrix.

However, these methods do not directly address the problem described earlier: apply shortening and puncturing in such a way that the code rate is approximately the same as the original one, and the coding gain is preserved.

One method attempting to solve this problem specifies shortening and puncturing such that the code rate of the original code is preserved. The following notation is used:

$N_{punctured}$—Number of punctured bits,
$N_{shortened}$—Number of shortened bits.

Shortening to puncturing ratio, q, is defined as: $q = N_{shortened}/N_{punctured}$. In order to preserve the same code rate, q has to satisfy the following equation:

$$q_{rate\_preserved} = R/(1-R)$$

In general, the amount of puncturing needs to be limited. Extensive puncturing beyond certain limits paralyzes the soft decision decoder.

The above described shortcomings may be addressed by:
(a) specifying general rules for shortening and puncturing patterns;
(b) providing mechanisms for $q < q_{rate\_preserved}$;
(c) establishing a limit on the amount of puncturing; and
(d) providing an algorithmic method for finding the optimal solution within the range of given system parameters.

This set of requirements may be beneficially applied to both the transmitter and the receiver. Although developed for wireless systems, embodiments of the invention can be applied to any other communication system that involves encoding of variable size data packets, by a fixed error correcting block code.

The advantage can be summarized as providing an optimal solution to the above-described problem given the range of the system parameters such as the performance, power consumption, and complexity. A method for encoding variable sized data using low-density parity-check (LDPC) code comprises the following steps:

1. Based on the data packet size determine the minimum number of required modulated symbols;
2. Select a codeword length from the set of available codeword lengths;
3. In an iterative loop, determine a required amount of shortening or, shortening and puncturing, and corresponding estimated performance, and add additional modulated symbol(s), if necessary;
4. Distribute the amount of shortening and puncturing across all constituent codewords efficiently; and
5. Append padding bits, if necessary.

Figure 6:
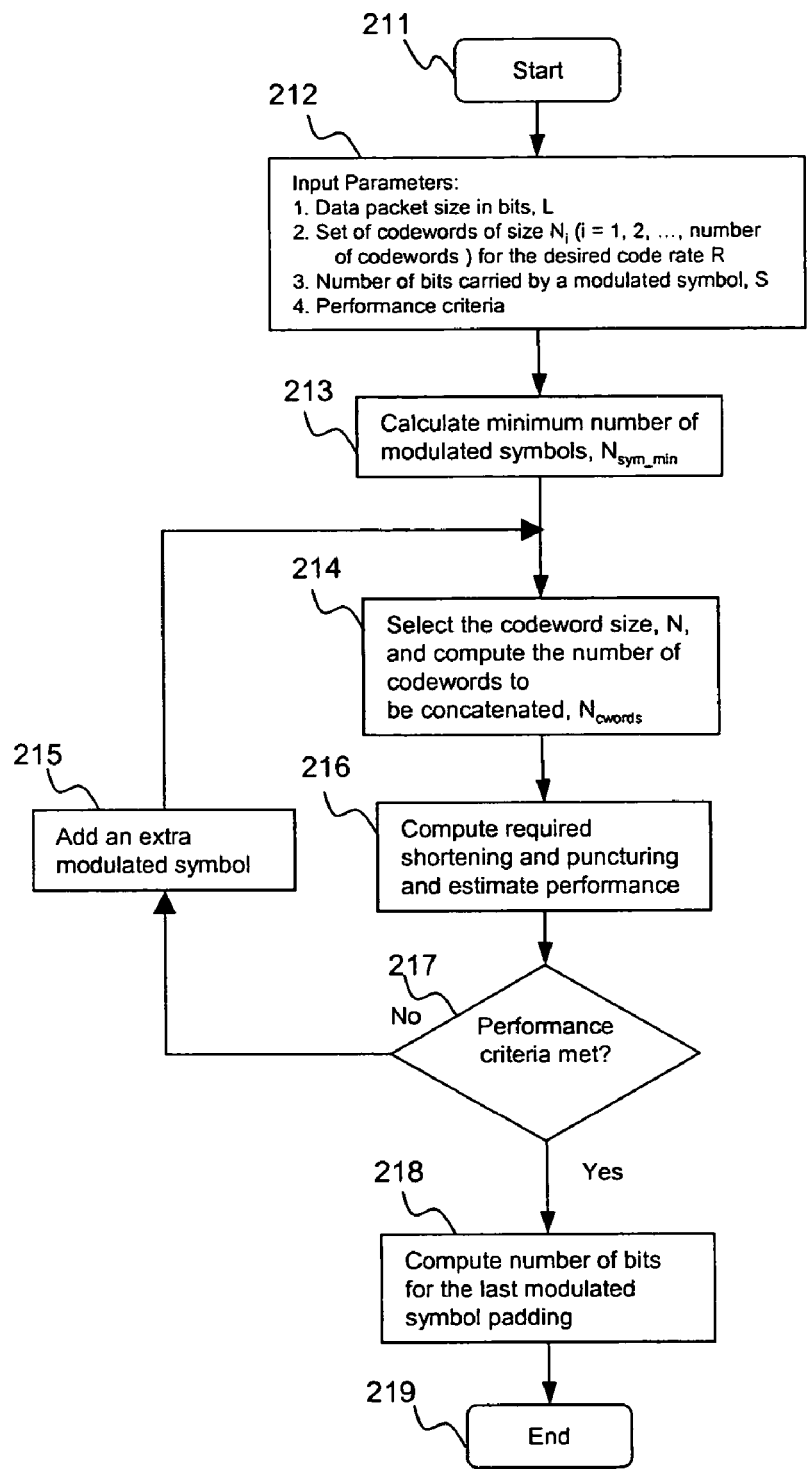
FIG. 6 illustrates encoding procedure in accordance with an embodiment of the present invention.

Referring to FIG. 6, these steps are more fully shown in the flow chart in which the process starts and various parameters are input 212 including:

Data packet size in bits, L;
Set of codewords of size Ni (i=1, 2, . . . , number_of_codewords) for the derived code rate R;
Number of bits carried by a modulated symbol S;
Performance criteria.

At step 213, the minimum number of modulated symbols $N_{sym\_min}$ is calculated. Next at step 214, the codeword size N is selected, and the number of codewords to be concatenated $N_{cwords}$ is computed. At step 216 the required shortening and puncturing are computed, and performance estimated. If the performance criteria are met 217, the number of bits required to pad the last modulated symbol is computed 218 and the process ends 219. Where the performance criteria are not met 217, an extra modulated symbol is added 215 and the step 214 is reentered.

Both the encoder and the decoder may be presented with the same input parameters in order to be able to apply the same procedure and consequently use the same codeword size, as well as other relevant derived parameters, such as amount of shortening and puncturing for each of the codewords, number of codewords, etc.

In some cases only the transmitter (encoder) has all the parameters available, and the receiver (decoder) is presented with some derived version of the encoding procedure parameters. For example, in some applications it is desirable to reduce the initial negotiation time between the transmitter and the receiver. In such cases the transmitter initially informs the receiver of the number of modulated symbols it is going to use for transmitting the encoded bits rather than the actual data packet size. The transmitter performs the encoding procedure differently taking into consideration the receiver's abilities (e.g. using some form of higher layer protocol for negotiation). Some of the requirements are relaxed in order to counteract deficiencies of the information at the receiver side. For example, the use of additional modulated symbols to enhance performance may always be in place, may be bypassed altogether, or may be assumed for the certain ranges of payload sizes, e.g. indirectly specified by the number of modulated symbols.

General Rules for Shortening and Puncturing

Much effort has been spent in coming up with designs of LDPC parity check matrices such that the derived codes provide near optimum performance. In order to provide optimum performance, known methods apply a particular variable nodes degree distribution. This distribution, in general, depends on the code rate and the size of the parity check matrix, or codeword. It is desirable that the puncturing and shortening pattern, as well as the number of punctured/shortened bits, are specified in such a way that the variable nodes degree distribution is preserved as much as possible. However, since shortening and puncturing are qualitatively different operations, different rules apply to them, as will be explained below.

(a) Rules for Shortening

Shortening of a code is defined as sending fewer information bits than is possible with a given code, K'<K. The encoding is performed by: taking K' bits from the information source, presetting the rest (K−K') of the information bit positions in the codeword to a pre-defined value, usually 0, computing M parity bits by using the full M×N parity check matrix, and finally forming the codeword to be transmitted by concatenating K' information bits and M parity bits. One way to determine which bits to shorten in the data portion of the parity check matrix, $H_d$ (31 in FIG. 2.), is to define a pattern which labels bits to be shortened, given the parity check matrix, $H=[H_d|H_p]$. This is equivalent to removing corresponding columns from $H_d$. The pattern is designed such that the degree distribution of the parity check matrix after shortening, i.e. removing appropriate columns from $H_d$, is as close as possible to the optimal one for the new code rate and the codeword length. To illustrate this, consider a matrix having the following sequence of weights (each number corresponds to a column weight):

3 3 3 8 3 3 3 8 3 3 3 8

When discarding columns, the aim is to ensure that the ration of '3's to '8's remains close to optimal, say 1:3 in this case. Obviously it cannot be 1:3 when one to three columns are removed. In such circumstances, the removal of 2 columns might result in e.g.:

3 3 8 3 3 8 3 3 3 8 giving a ratio of ~1:3.3 and the removal of a third column—one with weight '8'—might result in:

3 3 3 3 8 3 3 3 8 thus preserving a ratio of 1:3.5, which closer to 1:3 than would be the case where the removal of the third column with weight '3', which results in:

8 3 3 3 8 3 3 3 8 giving a ratio of 1:2.

It is also important to preserve approximately constant row weight throughout the shortening process.

Figure 7:
FIG. 7 illustrates rearranging of the columns in $H_d$ in order to enable efficient shortening.

An alternative to the above-described approach is to prearrange columns of the $H_d$ part of the parity check matrix, such that the shortening can be applied to consecutive columns in $H_d$. Although perhaps sub-optimal, this method keeps the degree distribution of $H_d$ close to the optimum. However, the simplicity of the shortening pattern, namely taking out the consecutive columns of $H_d$, gives a significant advantage by reducing complexity. Furthermore, assuming the original matrix satisfies this condition, approximately constant row weight is guaranteed. An example of this concept is illustrated in FIG. 7 where the original code rate R=½ matrix 220 is shown. In FIG. 7 (and FIG. 10) the white squares represent a z×z zero matrix, whereas the gray squares represent a z×z identity matrix shifted circularly to the right a number of times specified by the number written in the middle of the corresponding gray square. In this particular case, the maximum expansion factor is: $z_{max}=72$.

After rearranging the columns of the $H_d$ part of the original matrix, the new matrix takes on the form 221 shown in FIG. 7. It can be seen that if the shortening is performed as indicated (to the left from the $H_d/H_p$ boundary) the density of the new $H_d$ will slightly increase until it reaches a "heavy" weight columns (such as the block column 222). At that point the density of the new $H_d$ will again approach the optimum one. A person skilled in the art will note that the rearranging of the columns in $H_d$ does not alter the properties of the code.

In the case of a column regular parity check matrix, or more generally, approximately regular or regular and approximately regular only in the data part of the matrix, $H_d$, the method described in the previous paragraph is still preferred compared to the existing random or periodic/random approach. The method described here ensures approximately constant row weight, which is another advantage from the performance and the implementation complexity standpoint.

(b) Rules for Puncturing

Puncturing of a code is defined as removing parity bits from the codeword. In a wider sense, puncturing may be defined as removing some of the bits, either parity bits or data bits or both, from the codeword prior to sending the encoded bits to the modulator block and subsequently over the channel. The operation of puncturing increases the effective code rate. Puncturing is equivalent to a total erasure of the bits by the channel. The soft iterative decoder assumes a completely neutral value corresponding to those erased bits. In cases where the soft information used by the decoder is the log-likelihood ratio, this neutral value is zero.

Figure 8:
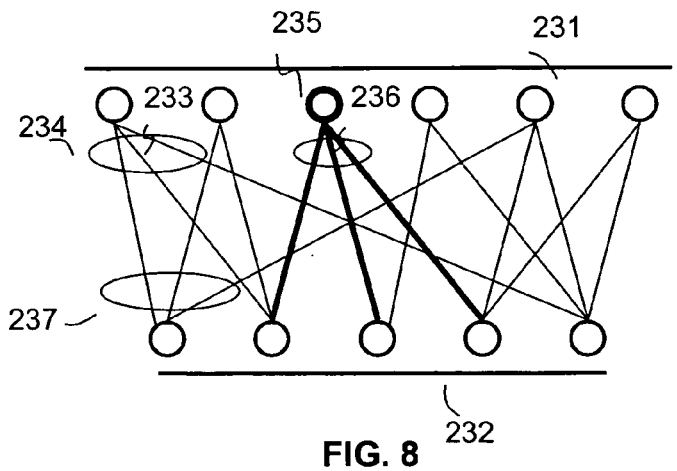
FIG. 8 shows a bipartite Tanner graph of an LDPC code with emphasis on a punctured bit.

Puncturing of LDPC codes can be given an additional, somewhat different, interpretation. An LDPC code can be presented in the form of the bipartite Tanner graph of FIG. 8, in which the codeword bits are represented by the variable nodes 231, and parity check equations by the check nodes 232.

Each variable node 231 is connected 234 by edges, for example 233, to all the check nodes 232 in which that particular bit participates. Similarly, each check node (corresponding to a parity check equation) is connected by a set of edges 237 to all variable nodes corresponding to bits participating in that particular parity check equation. If a bit is punctured, for example node 235, then all the check nodes connected to it, those connected by thicker lines 236, are negatively affected. Therefore, if a bit chosen for puncturing participates in many parity check equations, the performance degradation may be very high. On the other hand, since the only way that the missing information (corresponding to the punctured bits) can be recovered is from the messages coming from check nodes those punctured bits participate in, the more of those the more successful recovery may be. Faced with contradictory requirements, the optimum solution can be found somewhere in the middle. These general rules can be stated as following:

Bits selected for puncturing should be chosen such that each one is connected to as few check nodes as possible. This can also be stated as follows: bits selected for puncturing should not be the ones corresponding to the heavy-weight, or strong columns, i.e. columns containing large number of non-zero elements, 1's in this particular case.

Bits selected for puncturing should be chosen such that they all participate in as many parity check equations as possible.

Figure 9:
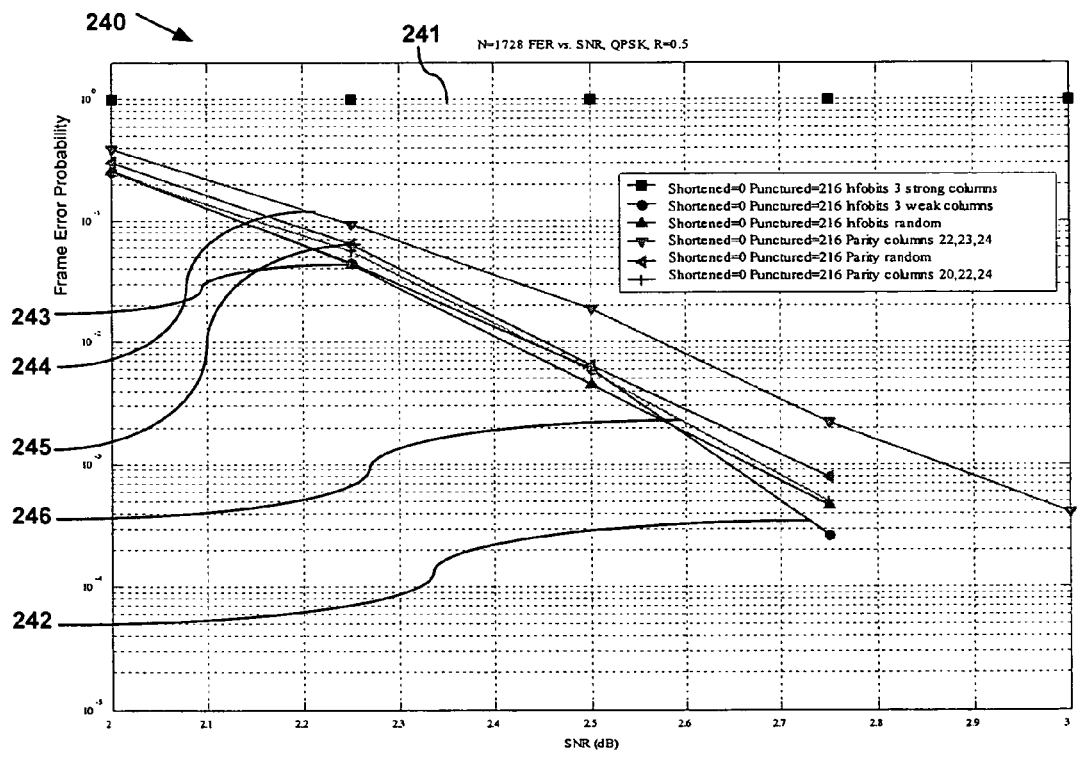
FIG. 9 illustrates puncturing impact on the performance.

Some of these trade-offs can be observed from FIG. 9 showing the frame error probability 240 for various situations.

Figure 10:
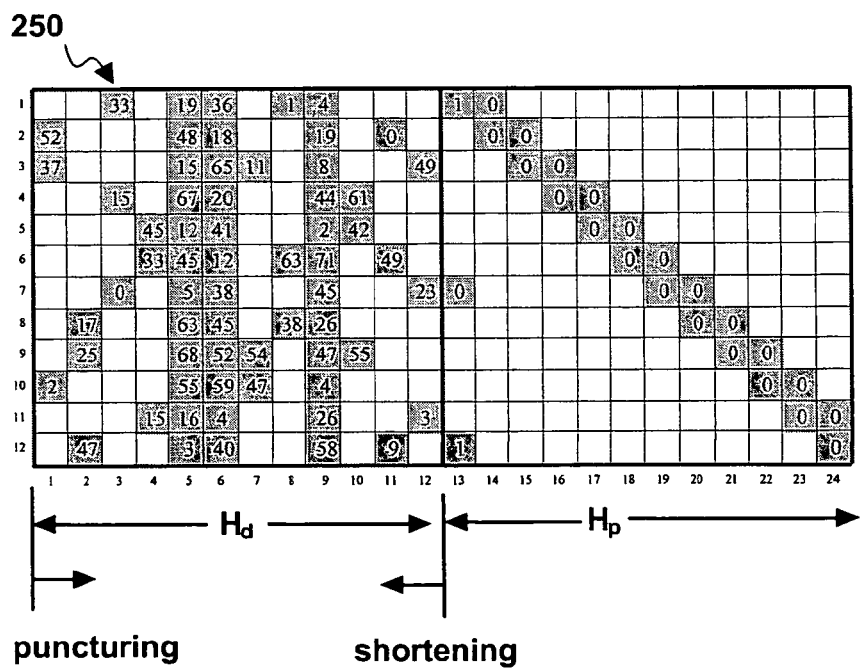
FIG. 10 is an example of a parity check matrix suited for both puncturing and shortening operation and used to obtain the results illustrated in FIG. 9.

FIG. 10 illustrates the base parity check matrix 250 used for obtaining the results in FIG. 9. The codeword size is 1728, which is obtained by expanding the base parity check matrix by the factor of z=72.

In FIG. 9, the curves are shown for six examples,
241: Shortened=0 Punctured=216 Infobits 3 strong columns
242: Shortened=0 Punctured=216 Infobits 3 weak columns,
243: Shortened=0 Punctured=216 Infobits random
244: Shortened=0 Punctured=216 Parity columns 22, 23, 24
245: Shortened=0 Punctured=216 Parity random and
246: Shortened=0 Punctured=216 Parity columns 20, 22, 24

It can be seen from the FIG. 9 that puncturing bits corresponding to heavyweight, or strong columns has a catastrophic effect on performance (241). On the other hand, puncturing block columns that do not participate in very many parity check equations does not provide very good performance either (244). The best results are obtained when both criteria are taken into account, as represented by curves 242, 243, 245, 246. Among all of those, it appears that for the particular matrix structure (irregular $H_d$ part with the modified dual diagonal in the $H_p$ part) the best results were obtained when the punctured bits were selected from those corresponding to the weak columns of the data part of the parity check matrix, $H_d$, (242). If the parity check matrix is arranged as in 221 of FIG. 7, then the puncturing bits can be selected by starting from the leftmost bit of $H_d$ and continuing with consecutive bits towards the parity portion $H_p$ of the matrix.

The matrix in FIG. 10 has undergone column rearrangement such that all the lightweight data columns have been put in the puncturing zone, i.e. leftmost part of the $H_d$ part of the parity check matrix.

As discussed previously, in the case where the preservation of the exact code rate is not mandatory, the shortening-to-puncturing ratio can be chosen such that it guarantees preservation of the performance level of the original code. Normalizing the shortening to puncturing ratio, q, as follows:

$$q_{normalized} = (N_{shortened}/N_{punctured})/[R/(1-R)],$$

means that q becomes independent of the code rate, R. Therefore, $q_{normalized}=1$, corresponds to the rate preserving case of combined shortening and puncturing. However, if the goal is to preserve performance, this normalized ratio must be greater than one: $q_{normalized}>1$. It was found through much experimentation that $q_{normalized}$ in the range of 1.2-1.5 complies with the performance preserving requirements.

A large percentage of punctured bits may paralyze the iterative soft decision decoder. In the case of LDPC codes this is true even if puncturing is combined with some other operation such as shortening or extending the code. One could conclude this by studying the matrix 250 of FIG. 10. Here, it can be seen that as puncturing progresses it is more and more likely that a heavy weight column will be hit. This is undesirable and has a negative effect on the code performance. Defining the puncturing percentage as:

$$P_{puncture} = 100 \times (N_{puncture}/M),$$

then it can be seen that the matrix 250 from FIG. 10 cannot tolerate puncturing in excess of $P_{puncture\_max}=33.3\%$. Therefore, this parameter $P_{puncture\_max}$ must be set and taken into account when performing the combined shortening and puncturing operation.

Pruning, which includes shortening and puncturing as described above, may include following characteristics:

Shortening, or combined shortening and puncturing, is applied in order to provide a large range of codeword sizes from a single parity check matrix;

The effective code rate of the code defined by the parity check matrix modified by shortening and puncturing is equal to or less than the original code rate;

Shortening is performed so that the column weight distribution of the modified matrix is optimal for the new matrix size and code rate. Another solution is to keep the column weight distribution of the new matrix only approximately optimum;

Shortening is performed so that the approximately uniform row weight is preserved;

Puncturing is performed so that each of the bits selected for puncturing is connected to as few check nodes as possible;

Puncturing is performed so that the bits selected for puncturing all participate in as many parity check equations as possible.

Puncturing is performed so that the approximately uniform row weight is preserved;

A sub-optimal but computationally efficient method is to first rearrange the columns of the data portion of the parity check matrix, $H_d$, by applying the preceding rules assuming that shortening is applied to a group of consecutive bits of the data portion of the parity check matrix and puncturing is applied to another group of consecutive bits of the data portion of the parity check matrix as illustrated by the example matrix 250 shown in FIG. 10;

Performance of the new code, which is obtained by applying both the shortening and puncturing, can be kept at the level of the original code by setting the normalized shortening to puncturing ratio, $q_{normalized}=(N_{shortened}/N_{punctured})/[R/(1-R)]$ greater than one. The $q_{normalized}$ value depends on the particular matrix design and the code rate, R. When the preservation of the original code rate is required, the normalized shortening to puncturing ratio shall be set to one ($q_{normalized}=1$);

The amount of puncturing is limited to a certain value, which depends on the particular parity check matrix design.

The above described method for shortening and puncturing is based on one codeword length selected from a set of available codeword lengths.

However, as for example described in the related International Application PCT/CA2005/001563, the entirety of which is incorporated herein by reference, a plurality of LDPC codes with different lengths and code rates is generally available.

The LDPC codes with different lengths and code rates generally result in a plurality of possible coding options, from which a coding option may be chosen based on the criteria as described above, namely:

(a) Keep the performance i.e. the coding gain as high as possible;

(b) Use as few modulated symbols as possible; and (c) Keep the overall complexity at a reasonable level.

In accordance with one embodiment of the present invention, the method for choosing a coding option from a plurality of possible coding options by shortening, or shortening and puncturing the plurality of LDPC codes with different lengths and code rates, may be described using the following non-limiting example.

Consider the following plurality of LDPC codes is available for transmission that includes codes with rates $R_{LDPC} = \{R_1, R_2, R_3, R_4\} = \{1/2, 2/3, 3/4, 5/6\}$, and code lengths $L_{LDPC} = \{L_1, L_2, L_3\} = \{648, 1296, 1944\}$ Consider the following set of parameters are the inputs provided to the encoding algorithm:

$N_{info}$, Number of payload bits to encode, payload bits may include the information bits and overhead bits $N_{cbps}$, Number of coded bits per OFDM symbol R, Requested coding rate.

Consider the following numeric values:

$N_{info}=696$ bits $N_{cbps}=312$ bits

R=3/4

The minimum number of OFDM symbols that can carry requested information load can be calculated as:

$$N_{OFDM\_min} = ceil\left(\frac{N_{info}}{R \cdot N_{cbps}}\right) = 3$$

Total number of available bits, to carry requested payload can be calculated as:

$$N_{available} = N_{OFDM\_min} \cdot N_{cbps} = 936$$

Number of codewords that will be used to carry requested information load can be calculated as:

$$N_{cw} = \min\left(\frac{N_{available}}{\max(L_{LDPC})}\right) = 1$$

Calculate number of shortened bits for every possible coding combination $$N_{shortened}^{i,j} = L_i \cdot R_j \cdot N_{cw} - N_{info}, \text{ where } L_i \in L_{LDPC}, \text{ and } R_j \in R_{LDPC}$$

The results of the calculation may be presented in graphical form:

$$N_{shortened} = \begin{array}{cccc} 1/2 & 2/3 & 3/4 & 3/4 \\ - & - & - & - & 648 \\ - & 168 & 276 & 384 & 1296 \\ 276 & 600 & 762 & 924 & 1944 \end{array}$$

Consider simple expansion criterion based only on normalized shortening to puncturing ratio $q_{normalized}$. Other possible expansion criteria are discussed in the related International Application PCT/CA2005/001563. In order to meet such criteria, extra OFDM symbols may be added. Number of punctured bits to meet a criteria $q_{normalized} \geq 1.2$ can be calculated as:

$$N_{punct\_allowed}^{i,j} = \text{floor}\left(N_{shortened}^{i,j} \cdot 1.2 \cdot \frac{1-R_j}{R_j}\right), \text{ where } R_j \in R_{LDPC}$$

in graphical form:

$$N_{punct\_allowed} = \begin{array}{cccc} 1/2 & 2/3 & 3/4 & 5/6 \\ - & - & - & - & 648 \\ - & 70 & 76 & 64 & 1296 \\ 230 & 250 & 211 & 154 & 1944 \end{array}$$

Number of OFDM symbols needed to carry information load with number of punctured bits can be calculated as:

$$N_{OFDM\_needed}^{i,j} = \text{ceil}\left(\frac{N_{info} + N_{cw} \cdot L_i \cdot (1-R_j) - N_{punct\_allowed}^{i,j}}{N_{cbps}}\right)$$

in graphical form:

$$N_{OFDM\_needed} = \begin{array}{cccc} 1/2 & 2/3 & 3/4 & 5/6 \\ - & - & - & - & 648 \\ - & 4 & 4 & 3 & 1296 \\ 5 & 4 & 4 & 3 & 1944 \end{array}$$

In next steps, different performance criteria to single out the choice of LDPC code will be applied. Different possible criteria are discussed in the related International Application PCT/CA2005/001563 and may be, for example, based on: a range of effective coding rates, more specifically, a minimum effective coding rate; a range of basic coding rates, more specifically, a minimum basic coding rate; a range of number of transmission symbols, more specifically, a minimum number of transmission symbols, a range of $N_{punctured}$, more specifically, a minimum for $N_{punctured}$; a range of $N_{shortened}$, more specifically, a maximum for $N_{shortened}$; a range of number of parity bits in LDPC codewords, more specifically, a maximum number of parity bits in LDPC codewords, a range for normalized shortening to puncturing ratio, $q_{normalized}$, more specifically, a maximum for $q_{normalized}$; or a combination thereof.

Step 1. Consider the next criterion being based on minimum basic coding rate. In particular, choose coding scenario that uses code rate equal or smaller than the requested coding rate: $R_j \leq R$, $R_j \in R_{LDPC}$. This step eliminates a choice of coding rate equal to 5/6.

$$N_{OFDM\_needed} = \begin{array}{cccc} 1/2 & 2/3 & 3/4 & 5/6 \\ - & - & - & - & 648 \\ - & 4 & 4 & - & 1296 \\ 5 & 4 & 4 & - & 1944 \end{array}$$

Step 2. Consider next criterion being based on minimum OFDM symbols. In particular, choose coding scenario that uses minimum OFDM symbols. This step eliminates the choice of using 5 OFDM symbols.

$$N_{OFDM\_needed} = \begin{array}{cccc} 1/2 & 2/3 & 3/4 & 5/6 \\ - & - & - & - & 648 \\ - & 4 & 4 & - & 1296 \\ - & 4 & 4 & - & 1944 \end{array}$$

Step 3. Consider next criterion being based on maximum number of parity bits used for payload transmission. Calculate number of parity bits used for all remaining coding scenarios:

$$N_{Parity}^{i,j} = \min(N_{OFDM\_needed}^{i,j} \cdot N_{CBPS} - N_{info}, N_{cw}L_i \cdot (1-R_j))$$

$$N_{Parity\_used} = \begin{array}{cccc} 1/2 & 2/3 & 3/4 & 5/6 \\ - & - & - & - & 648 \\ - & 432 & 324 & - & 1296 \\ - & 552 & 486 & - & 1944 \end{array}$$

Out of the remaining coding options, choose coding scenario that uses maximum number of parity bits. Number of parity bits used reaches maximum at rate 2/3 and code length 1944. This coding option will become the coding choice.

$$N_{Parity\_used} = \begin{array}{cccc} 1/2 & 2/3 & 3/4 & 5/6 \\ - & - & - & - & 648 \\ - & - & - & - & 1296 \\ - & 552 & - & - & 1944 \end{array}$$

Embodiments of the invention can be implemented in digital electronic circuitry, or in computer hardware, firmware, software, or in combinations thereof. Apparatus of the invention can be implemented in a computer program product tangibly embodied in a machine-readable storage device for execution by a programmable processor; and method actions can be performed by a programmable processor executing a program of instructions to perform functions of the invention by operating on input data and generating output. The invention can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object oriented programming language, or in assembly or machine language if desired; and in any case, the language can be a compiled or interpreted language. Suitable processors include, by way of example, both general and special purpose microprocessors. Generally, a processor will receive instructions and data from a read-only memory and/or a random access memory. Generally, a computer will include one or more mass storage devices for storing data files. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits). Further, a computer data signal representing the software code which may be embedded in a carrier wave may be transmitted via a communication network. Such a computer readable memory and a computer data signal are also within the scope of the present invention, as well as the hardware, software and the combination thereof.

While particular embodiments of the present invention have been shown and described, changes and modifications may be made to such embodiments without departing from the true scope of the invention.

What is claimed is:

1. A method for selecting a low-density parity-check (LDPC) code used for encoding variable sized data, the method comprising the steps of:
   providing a plurality of LDPC codes of different codeword lengths and code rates;
   calculating a number of shortening $N_{shortened}$ bits for each of the plurality of LDPC codes;
   calculating a number of puncturing $N_{punctured}$ bits for each of the plurality of LDPC codes;
   providing a performance criterion;
   determining, in a computer processor, a selected LDPC code from the plurality of shortened LDPC codes and the plurality of punctured LDPC codes meeting the performance criterion; and
   encoding data using the selected LDPC code.

2. The method according to claim 1 further comprising the steps of:
   providing a plurality of performance criteria; and
   determining a subsequent subset when each of the plurality of performance criteria is applied to the subsets of LDPC codes meeting previous criteria.

3. The method according to claim 1, wherein the performance criterion is selected from the group consisting of a range of effective coding rates, a range of basic coding rates, a range of numbers of transmission symbols, a range of $N_{punctured}$, a range of $N_{shortened}$, a range of parity bits in LDPC codewords, a range for normalized shortening to puncturing ratio, $q_{normalized}$, and a combination thereof.

4. The method according to claim 1, wherein the performance criterion is selected from the group consisting of a minimum effective coding rate, a minimum basic coding rate, a minimum number of transmission symbols, a minimum for $N_{punctured}$, a maximum for $N_{shortened}$, a maximum number of parity bits in LDPC codewords, a maximum for normalized shortening to puncturing ratio, $q_{normalized}$, and a combination thereof.

5. The method of claim 1 further comprising the steps of:
   selecting $N_{shortened}$ variable nodes from the selected LDPC code;
   ensuring a uniform or a close to uniform row weight distribution after removing columns corresponding to the selected $N_{shortened}$ variable nodes; and
   ensuring a new column weight distribution as close as possible to an original column weight distribution after removing the columns corresponded to the selected $N_{shortened}$ variable nodes.

6. The method of claim 5, wherein the step of selecting $N_{shortened}$ variable nodes further comprises the step of selecting variable nodes belonging to consecutive columns in of the selected LDPC code.

7. The method of claim 5, wherein the ensuring a new column weight distribution step further comprises the step of prearranging columns of the data portion $H_d$ of the plurality of LDPC codes.

8. The method of claim 1 further comprising the steps of:
   selecting $N_{punctured}$ variable nodes from the selected LDPC code; ensuring each of the selected $N_{punctured}$ variable nodes is connected to fewest possible check nodes; and
   ensuring that all of the selected $N_{punctured}$ nodes are connected to most possible check nodes.

9. The method of claim 8 wherein the ensuring further comprises the step of selecting variable nodes that belongs to consecutive columns in the selected LDPC code.

10. A device encoding data using a selected LDPC code obtained by:
    providing a plurality of LDPC codes of different codeword lengths and code rates;
    calculating a number of shortening $N_{shortened}$ bits for each of the plurality of LDPC codes;
    calculating a number of puncturing $N_{punctured}$ bits for each of the plurality of LDPC codes;
    providing a performance criterion;
    determining a selected LDPC code from the plurality of shortened LDPC codes and the plurality of punctured LDPC codes meeting the performance; and
    providing the selected LDPC code.

11. A storage medium readable by a computer encoding a computer program for execution by the computer to carry out a method for selecting a low-density parity-check (LDPC) code used for encoding variable sized data, the method comprising:
    providing a plurality of LDPC codes of different codeword lengths and code rates;
    calculating a number of shortening $N_{shortened}$ bits for each of the plurality of LDPC codes;
    calculating a number of puncturing $N_{punctured}$ bits for each of the plurality of LDPC codes;
    providing a performance criterion;
    determining a selected LDPC code from the plurality of shortened LDPC codes and the plurality of punctured LDPC codes meeting the performance criterion; and
    encoding data using the selected LDPC code.

12. The storage medium according to claim 11, wherein the method further comprises:

providing a plurality of performance criteria; and determining a subsequent subset when each of the plurality of performance criteria is applied to the subsets of LDPC codes meeting previous criteria.

13. The storage medium according to claim 11, wherein the performance criterion is selected from the group consisting of a range of effective coding rates, a range of basic coding rates, a range of numbers of transmission symbols, a range of $N_{punctured}$, a range of $N_{shortened}$, a range of parity bits in LDPC codewords, a range for normalized shortening to puncturing ratio, $q_{normalized}$, and a combination thereof.

14. The storage medium according to claim 11, wherein the performance criterion is selected from the group consisting of a minimum effective coding rate, a minimum basic coding rate, a minimum number of transmission symbols, a minimum for $N_{punctured}$, a maximum for $N_{shortened}$, a maximum number of parity bits in LDPC codewords, a maximum for normalized shortening to puncturing ratio, $q_{normalized}$, and a combination thereof.

15. The storage medium according to claim 11, wherein the method further comprises:

selecting $N_{shortened}$ variable nodes from the selected LDPC code;

ensuring a uniform or a close to uniform row weight distribution after removing columns corresponding to the selected $N_{shortened}$ variable nodes; and ensuring a new column weight distribution as close as possible to an original column weight distribution after removing the columns corresponded to the selected $N_{shortened}$ variable nodes.

16. The storage medium according to claim 11, wherein the selecting $N_{shortened}$ variable nodes further comprises selecting variable nodes belonging to consecutive columns in of the selected LDPC code.

17. The storage medium according to claim 11, wherein the ensuring a new column weight distribution step further comprises prearranging columns of the data portion $H_d$ of the plurality of LDPC codes.

18. The storage medium according to claim 11, wherein the method further comprises:

selecting $N_{punctured}$ variable nodes from the selected LDPC code; ensuring each of the selected $N_{punctured}$ variable nodes is connected to fewest possible check nodes; and ensuring that all of the selected $N_{punctured}$ nodes are connected to most possible check nodes.

19. The storage medium according to claim 11, wherein the ensuring further comprises selecting variable nodes that belongs to consecutive columns in the selected LDPC code.

* * * * *

UNITED STATES PATENT AND TRADEMARK OFFICE
CERTIFICATE OF CORRECTION

PATENT NO.        : 7,747,934 B2
APPLICATION NO.   : 11/454824
DATED             : June 29, 2010
INVENTOR(S)       : Michael Livshitz It is certified that error appears in the above-identified patent and that said Letters Patent is hereby corrected as shown below:

On the title page, item [60]
On page 1, please delete "60/639,420, filed on Dec. 22, 2004," and insert therefor
--60/639,420, filed on Dec. 27, 2004--.

On page 2, in "Other Publications", please delete "Lindskog, et al., "Record and Playback PHY Abstraction for 802.11N MAC Simulations-Using Soft Per Estimates", IEEE 802.11-0410182 00R1" and insert therefor --Lindskog, et al., "Record and Playback PHY Abstraction for 802.11N MAC Simulations-Using Soft Per Estimates", IEEE 802.11-04/018200R1--.

On page 2, in "Other Publications", please delete "Sampath, et al., "Record and Playback PHY Abstraction for 802.11N MAC Simulations", IEEE 802.11-041018300R3" and insert therefor --Sampath, et al., "Record and Playback PHY Abstraction for 802.11N MAC Simulations", IEEE 802.11-04/018300R3--.

On page 2, in "Other Publications", please delete "Purkovic, et al., "LDPV vs. Convolutional Codes for 802.11n Applications: Performance Comparison", Nortel Networks, IEEE 802.11- 04,0071r1" and insert therefor --Purkovic, et al., "LDPV vs. Convolutional Codes for 802.11n Applications: Performance Comparison", Nortel Networks, IEEE 802.11- 04/0071rl--.

On page 2, in "Other Publications", please delete "Liang, et al., "Simplifying MAC FEC Implementation and Related Issues", Texas Instruments Incorporated, IEEE 802.11-0210207r0" and insert therefor --Liang, et al., "Simplifying MAC FEC Implementation and Related Issues", Texas Instruments Incorporated, IEEE 802.11-02/0207r0--.

On page 2, in "Other Publications", please delete "Coffey, et al., "MAC FEC Performance", Texas Instruments, IEEE 802.11-021239r0" and insert therefor --Coffey, et al., "MAC FEC Performance", Texas Instruments, IEEE 802.11-02/239r0--.

Signed and Sealed this

Thirty-first Day of August, 2010

David J. Kappos
*Director of the United States Patent and Trademark Office*